United States Patent [19]
Mizuno et al.

[11] Patent Number: 5,893,962
[45] Date of Patent: Apr. 13, 1999

[54] ELECTRODE UNIT FOR IN-SITU CLEANING IN THERMAL CVD APPARATUS

[75] Inventors: Shigeru Mizuno, Kawasaki; Manabu Tagami, Fuchu; Takanori Yoshimura, Hino, all of Japan

[73] Assignee: Anelva Corporation, Tokyo, Japan

[21] Appl. No.: 08/711,204

[22] Filed: Sep. 9, 1996

[30] Foreign Application Priority Data

Sep. 19, 1995 [JP] Japan .................................. 7-264833

[51] Int. Cl.[6] .................................................. C23C 16/00
[52] U.S. Cl. ........................ 118/723 E; 118/723 R; 118/715; 156/345
[58] Field of Search .................. 118/723 R, 723 E, 118/723 ER, 715; 156/345; 204/298.06, 298.34; 134/1.1

[56] References Cited

U.S. PATENT DOCUMENTS

| | | |
|---|---|---|
| 5,006,192 | 4/1991 | Deguchi et al. .................. 156/345 |
| 5,326,723 | 7/1994 | Petro et al. . |
| 5,651,867 | 7/1997 | Kokaku et al. .................. 204/298.25 |
| 5,676,758 | 10/1997 | Hasegawa et al. .............. 118/723 E |
| 5,693,147 | 12/1997 | Ward et al. ....................... 134/1.1 |

*Primary Examiner*—Bruce Breneman
*Assistant Examiner*—Luz Alejandro
*Attorney, Agent, or Firm*—Oliff & Berridge, PLC

[57] ABSTRACT

An electrode unit of a thermal CVD apparatus is used to generate plasma discharge for an in-situ cleaning process. The electrode unit is configured by a substrate holder and a shield member connected to a high frequency power supply, the gas supply section electrically grounded, and an auxiliary electrode disposed in the gas supply section. In a film deposition process, a reactive gas is supplied from the gas supply section, and the reactive gas is excited in a space in front of a substrate to deposit a thin film onto the substrate. In a periodical in-situ cleaning process, a cleaning gas is supplied from the gas supply section and a cleaning discharge is generated to remove unwanted films deposited on the substrate holder and the shield member. The auxiliary electrode causes the cleaning discharge to be concentrated in a space around unwanted films.

18 Claims, 8 Drawing Sheets

ELECTRODE UNIT FOR IN-SITU CLEANING IN THERMAL CVD APPARATUS

BACKGROUND OF THE INVENTION

1. Field of the Invention

The present invention relates to an electrode unit for in-situ cleaning in a thermal CVD apparatus, and, more particularly, to an electrode unit suitable for in-situ cleaning in a thermal CVD apparatus, improving cleaning rate and productivity in thin film deposition.

2. Description of the Related Art

In recent manufacturing of semiconductor chips, electronic circuit elements in the semiconductor chips are more and more integrated and miniaturized. Miniaturization of the elements in the manufacturing process requires new techniques. These techniques are, for example, of sufficiently filling fine holes with films, forming favorable step coverage, reducing heat due to high current density, and preventing damage to wiring due to electromigration. As one of the manufacturing processes meeting such technical requirements, in place of a sputtering process, a thermal CVD (chemical vapor deposition) process attracts attention. At present, in accordance with the thermal CVD process, blanket tungsten film or TiN film is mainly deposited on a substrate. In the blanket tungsten film deposition $H_2$ and $WF_6$ (tungsten hexafluoride) gases are used. The blanket tungsten film is hereinafter referred as a "B-W film". In the TiN film deposition an organic metal gas such as TDEAT (tetradiethylaminotitanium) or TDMAT (tetradimethylaminotitanium) is used as precursors.

When utilizing the thermal CVD process, step coverage can be sufficiently improved for fine holes with a diameter of 0.35 μm or less and an aspect ratio of 4 or more. Thus, the thermal CVD process satisfies the requirements of planarization steps of elements and preventing electro-migration.

A conventional example of a thermal CVD apparatus for depositing the B-W films on a substrate will be described with reference to FIG. 7.

The conventional thermal CVD apparatus shown in FIG. 7 has a gas supply plate 112 at the top of a reactor 111 and a conductive substrate holder 113 at the bottom thereof. A substrate 114 is located on the top surface of the substrate holder 113. The top surface of the substrate holder 113 is circular, and the substrate holder 113 is supported by a plurality of insulating supporting members 115. The reactor 111 has a transmitting quartz window 116 in its bottom wall.

The gas supply plate 112 has a plurality of gas outlets 117 in its bottom surface. Reactive gas supplied by a reactive gas supply mechanism 118 passes through a gas supply pipe 119 and is blown off from the gas outlets 117 so as to be introduced into the reactor 111. The bottom surface of the gas supply plate 112 is opposed to the substrate 114 placed on the substrate holder 113. The reactive gas supplied from the gas supply plate 112 is excited in the space between the gas supply plate 112 and the substrate holder 113. Consequently, a desired thin film can be deposited on the top surface of the substrate 114 placed on the substrate holder 113. Unreacted gas and by-products generated within the reactor 111 are evacuated to the outside through an evacuation section 120. The illustration of an evacuation vacuum pump is omitted in FIG. 7.

A shield member 121 is arranged around the substrate holder 113. This shield member 121 has a ring plate portion 121a and a cylindrical portion 121b. The shield member 121 is conductive. The ring plate portion 121a is located above the substrate holder 113 and around the substrate 114. In accordance with their positional relationship, there is a gap between the ring plate portion 121a and the top surface of the substrate holder 113. The cylindrical portion 121b is also located around the substrate holder 113. Further, the shield member 121 is located on a ring-shaped insulating member 122 disposed on the bottom wall of the reactor 111.

A combination of the bottom wall of the reactor 111, the ring plate portion 121a, the cylindrical portion 121b, and the substrate holder 113 forms a path through which a purge gas (an inert gas) flows. The purge gas is supplied by a purge gas supply mechanism 123 through a purge gas introduction section 124. The purge gas introduced into the reactor 111 via the purge gas introduction section 124 passes through the gap between the ring plate portion 121a and the substrate holder 113. After the purge gas passes through the gap, it is blown off into the reactor 111 from the overall periphery of the substrate 114. This configuration prevents the reactive gas supplied from the gas supply plate 112 from entering the gap. Therefore, the purge gas can prevent unwanted films from being deposited around the circumference of the substrate holder 113 or on the quartz window 116. Further, the shield member 121 serves to prevent the heated substrate holder 113 from being directly exposed to the reactive gas.

An annular lamp support member 125 with a reflecting section is arranged below the quartz window 116 in the bottom wall of the reactor 111. A plurality of heating lamps 126 are mounted on the lamp support member 125 at an almost equal interval. Radiant heat from the heating lamps 126 is transmitted to the substrate holder 113 through the quartz window 116 to heat the substrate holder 113. The substrate 114 is also heated by heat transferred from the substrate holder 113. The temperature of the substrate holder 113 is detected by a thermocouple 127 embedded therein, and a detected signal is fed back to a controller (not shown) so as to be used to control the temperature of the substrate holder 113.

The reactor 111 is electrically grounded at a ground point 128. In addition, a high frequency power supply 130 is connected to both the substrate holder 113 and the shielding member 121 via a matching circuit 129. High frequency power is supplied to both the substrate holder 113 and the shielding member 121. Reference numeral 131 designates an insulating section of the reactor 111 into which a connection line for the high frequency power is inserted.

In accordance with the above configuration, the reactive gas is supplied to the substrate 114 placed on the substrate holder 113, and the reactive gas is excited in the space between the gas supply plate 112 and the substrate holder 113 or the shield member 121, thereby depositing the desired thin film on the substrate 114. The unreacted gas and by-products in the reactor 111 are evacuated by the evacuation section 120. During a thin film deposition process, the purge gas supplied by the purge gas introduction section 124 via the purge gas supply path is continued to be blown off from the above-mentioned gap. The blow-off of the purge gas from the periphery of the substrate 114 prevents the reactive gas from entering the gap, thereby preventing the unwanted films from being deposited on the quartz window 116 and the like.

The normal conditions for the thin film deposition in the conventional thermal CVD apparatus are as follows. In the initial stage of nucleation, the conditions are a 2–10 sccm flow rate for $WF_6$ as the reactive gas, a 2–10 sccm flow rate for $SiH_4$, a 100–500 sccm flow rate for Ar as the purge gas, 400–500° C. for the temperature, and 66–1330 Pa for the pressure. In the subsequent stage of film growth by $H_2$ reduction, the conditions are a 50–200 sccm flow rate for $WF_6$, a 500–2000 sccm flow rate for $H_2$, a 300–1000 sccm flow rate for Ar as the purge gas, 400–500° C. for the temperature, and 4000–9000 Pa for the pressure.

On the other hand, as shown in FIG. 8, films 132 as deposits are deposited on the part of the ring plate portion 121a, or the part of the substrate holder 113 which is not covered by the substrate 114. Of course, the deposited films 132 are not desirable because they generate contamination particles and therefore productivity in the thin film deposition process may be reduced. Accordingly, in the conventional thermal CVD apparatus, a RIE (reactive ion etching) process was carried out in order to remove the undesirable deposited films 132 as an in-situ cleaning process in the reactor 111 for each substrate or every certain number of lots. The cleaning process by the RIE was carried out by an cleaning gas. This cleaning gas is supplied by a cleaning gas supply mechanism 133 via the gas supply pipe 119, and is introduced into the reactor 111 through the gas supply plate 112. Further, plasma discharge with the cleaning gas is generated.

If $CF_4$ and $O_2$ are used as the cleaning gas, the normal cleaning conditions are a 50–150 sccm flow rate for $CF_4$, a 20–90 sccm flow rate for $O_2$, 90–300 Pa for the pressure, and 300–600 W for the high frequency power applied to the substrate holder 113 and the shield member 121.

As being clear in accordance with the above description, the productivity of the conventional thermal CVD apparatus depends on both the deposition rate in the film deposition process and the cleaning rate in the cleaning process.

The above-mentioned conventional thermal CVD apparatus has the following problems.

In accordance with the thermal CVD apparatus having a parallel plate electrode unit, if the RIE discharge process is carried out in order to clean the unwanted films 132 deposited the top surface of the subtract holder 113 or the shield member 121, the cleaning discharge due to the RIE occurs all over the space between the substrate holder 113 and the gas supply plate 112. The RIE discharge process causes a wide discharge in an area wider than the area necessary for the unwanted films 132 to be removed, thereby allowing the power of the discharge for RIE to be dispersed and furthermore the cleaning rate for removing the films 132 to be reduced.

In addition, in the conventional thermal CVD apparatus, if the pressure for the RIE discharge is increased to improve the cleaning rate, the RIE discharge becomes unstable. Further the RIE discharge is apt to occur in a relatively narrow space, for example, in the space between the shield member 121 and the wall of the reactor 111 rather than the space between the gas supply plate 112 and the substrate holer 113. Consequently, the high pressure results in low efficiency.

Even if the pressure for the RIE discharge is relatively high, the RIE discharge may be stabilized by reducing the distance between the gas supply plate 112 and the substrate holder 113. The substrate holder 113, however, is normally maintained at high temperature, that is, 400–500° C., so the temperature of the surface close to the substrate holder 113 increases, and the film may be deposited on the surface of the gas supply plate 112. The unwanted films will generate contamination particles that may reduce the productivity in the thermal CVD apparatus. In addition, a special drive mechanism for vertically moving the gas supply plate 112 or substrate holder 113 will be required in order to have a space for transferring substrates. Consequently, the internal structure of the thermal CVD apparatus is complicated, thereby decreasing the maintainability and increasing the trouble rate.

SUMMARY OF THE INVENTION

An object of the present invention is to provide an electrode unit for in-situ cleaning in a thermal CVD apparatus in order to solve the above problems, which is used to carry out the cleaning at a high rate, and provides high productivity in film deposition on substrates.

An electrode unit of the present invention is used to generate plasma discharge for an in-situ cleaning process in a thermal CVD apparatus. The thermal CVD apparatus comprises a reactor, an evacuation device for evacuating the inside of the reactor, a substrate holder for holding a substrate in the reactor, a shield member arranged around the substrate holder to form a purge gas path in which a purge gas flows, a purge gas supply device for supplying the purge gas to the purge gas path, and a gas supply section for supplying a reactive gas or a cleaning gas into the reactor. The electrode unit as a feature of the present invention comprises the substrate holder and the shield member which are connected to a high frequency power supply mechanism and the, gas supply section connected to the ground, and further includes an auxiliary electrode disposed in the gas supply section.

During a film deposition process, the thermal CVD apparatus supplies the reactive gas from the gas supply section, and generates the reactive gas excitation in the space in front of the substrate to deposit a thin film onto the top surface of the substrate. The in-situ cleaning process is periodically carried out in the thermal CVD apparatus. During the in-situ cleaning process, a cleaning discharge occurs to remove unwanted films as deposits deposited on the substrate holder and the shield member by utilizing the cleaning gas supplied from the same gas supply section. The auxiliary electrode has a form suitable for concentrating the cleaning discharge in a space around the unwanted films.

Since the unwanted films are deposited on the parts of the substrate holder and the shield member during the film deposition process utilizing thermal CVD, the films are removed by the cleaning discharge during the cleaning process. The auxiliary electrode used only for the cleaning process causes the cleaning discharge to be concentrated in the specific space near the unwanted films to be removed. It is desirable to set the inside of the reactor at a relatively high pressure in order to generate the cleaning discharge concentrated in the desired space by utilizing the particular form of the auxiliary electrode. Thus, the cleaning discharge limited to the desired space can improve the cleaning rate and efficiently remove the unwanted films. The thermal CVD apparatus of the present invention can provide high productivity.

The auxiliary electrode preferably comprises a cylindrical portion attached to the gas supply section and extending toward the substrate, and a collar portion formed around the periphery of the end opening of the cylindrical portion. The collar portion has a form of a planar ring plate, and covers the surfaces of the substrate holder and the shield member on which the unwanted films may be deposited. The collar portion is opposed to the surfaces of the substrate holder and the shield member. There is a gap between the collar portion and each of the surfaces. The cleaning discharge is concentrated in the gap between the collar portion and each of the surfaces.

The cylindrical portion is not necessarily required for the auxiliary electrode. It is sufficient for the auxiliary electrode to have a first portion with function equivalent to the collar portion and a second portion for fixing the first portion to the gas supply section.

The gas supply section is desirable to have a cooling mechanism. The cooling mechanism can keep the temperature of the gas supply section and the auxiliary electrode from being increased. The auxiliary electrode can be configured so as to allow cooling media such as water to flow.

Materials for the auxiliary electrode preferably include corrosion-resistant metallic materials such as "MONEL" and nickel. Since the auxiliary electrode is directly exposed to the cleaning discharge, it is desirably made of a corrosion-resistant conductive material.

The radius of the cylindrical portion of the auxiliary electrode is preferably equal to or smaller than the radius of the substrate. The radius of the cylindrical portion is preferably determined to allow the bottom surface of the collar portion to cover the surfaces on which the unwanted films have been deposited.

The radial length (width) of the collar portion of the auxiliary electrode is preferably equal to or larger than the radial range of the films deposited on both the substrate holder and the shield member. By setting the size of the collar portion as described above, the collar portion can cover all the surfaces on which the unwanted films have deposited during the thin film deposition process, thereby causing the cleaning discharge to be generated in a desired space.

Further, the above auxiliary electrode can be configured by a ring section and supporting members for supporting the ring section. In addition, a cooling water path can be formed inside the ring section and the supporting members.

DETAILED DESCRIPTION OF THE PREFERRED EMBODIMENTS

Preferred embodiments of the present invention will be described with reference to the accompanying drawings.

Figure 1:
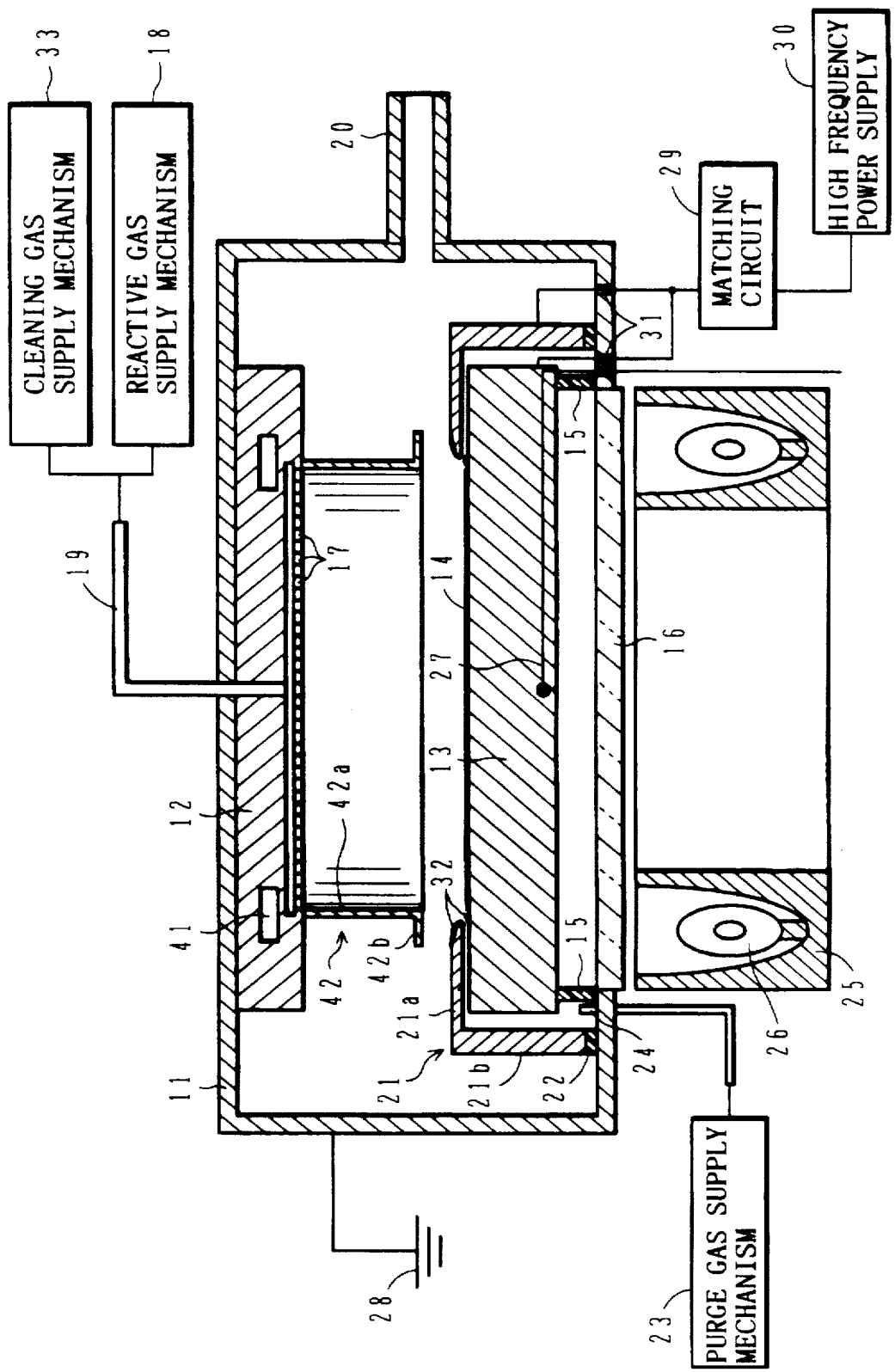
FIG. 1 is a longitudinal sectional view schematically showing a first embodiment of an electrode unit for a thermal CVD apparatus according to the present invention.

The present invention is characterized by the structure and shape of an electrode unit that causes plasma discharge for a cleaning process. Before describing the characteristic of the electrode unit, the overall configuration of a thermal CVD apparatus with the electrode unit is explained with reference to FIG. 1. The basic configuration of the thermal CVD apparatus is substantially the same as that of the conventional apparatus described above.

A reactor 11 is electrically grounded at a ground point 28, and has at its top a gas supply plate 12 and at its bottom an electric conductive substrate holder 3 on which a substrate 14 is clamped. The substrate holder 13 is supported by insulating supporting members 15. The gas supply plate 12 is mounted to the reactor 11 and maintained at the ground potential. The gas supply plate 12 can be selectively connected to each of a reactive gas supply mechanism 18 and a cleaning gas supply mechanism 33 via a gas supply pipe 19. The gas supply plate 12 has a plurality of gas outlets 17 in its bottom surface. Reactive gas supplied through the gas supply pipe 19 (during a film deposition process) or cleaning gas (during a cleaning process) is blown off from the gas outlets 17 into the reactor 11. A water cooling mechanism 41 is contained in the inside of the gas supply plate 12. A transmitting quartz window 16 is arranged in the bottom wall of the reactor 11 below the substrate holder 13.

The space between the gas supply plate 12 and the substrate holder 13 or between the gas supply plate 12 and the shield member 21 has a condition to cause the reactive gas to be excited. The reactive gas supplied from the gas supply plate 12 can cause a desired thin film to be deposited on the top surface of the substrate 14. Unreacted gas and by-products generated within the reactor 11 are evacuated to the outside through an evacuation section 20.

The conductive shield member 21, including a ring plate portion 21a and a cylindrical portion 21b, is located around the substrate holder 13. Further the shield member 21 located on a ring-shaped insulating member 22 disposed in the bottom wall of the reactor 11. A path through which purge gas (inert gas such as argon) flows is formed by the bottom wall of the reactor 11, the shield member 21, and the substrate holder 13. The purge gas is supplied by a purge gas supply mechanism 23 via a purge gas introduction section 24. The purge gas passes through the gap between the ring plate portion 21a and the substrate holder 13, and is blown off into the reactor 11 from the periphery of the substrate 14. The blowing-off the purge gas prevents the reactive gas from entering the gap, and further prevents the unwanted films from being deposited on the circumference of the substrate holder 13 or the quartz window 16.

A lamp supporting member 25 is arranged below the quartz window 16 of the reactor 11. A plurality of heating lamps 26 are disposed in the lamp supporting member 25. Radiant heat from the heating lamps 26 is irradiated to heat the substrate holder 13 through the quartz window 16. The temperature of the substrate 14 is increased by heat transferred from the substrate holder 13. The temperature of the substrate holder 13 is detected by a thermocouple 27, and a detected signal is fed back to a controller (not shown) which controls the temperature of the substrate holder 13.

A high frequency power supply 30 is connected to both the substrate holder 13 and the shielding member 21 via a matching circuit 29 in order to supply high frequency electric power to them.

According to the above configuration, the reactive gas is supplied to the substrate 14 loaded on the substrate holder 13, and further the reactive gas excitation condition is generated in the space between the gas supply plate 12 and each of the substrate holder 13 and the shield member 21 to deposit a desired thin film on the substrate 14. The unreacted gas and by-products are evacuated through the evacuation section 20. During the film deposition, the purge gas is supplied to prevent the reactive gas from entering the gap between the ring plate portion 21a and the substrate holder 13. The typical thin film deposition conditions have been described in the above Related Art.

As described above, during the thin film deposition process, W films 32 are undesirably deposited on the top surface of the substrate holder 13 and the inner circumferential end of the top surface of the ring plate portion 21a. Then, an in-situ cleaning process due to RIE is carried out to remove the unwanted W films 32 as deposits every predetermined number of times concerning the thin film deposition process.

In the thermal CVD apparatus of the present embodiment, an auxiliary electrode 42 used for the in-situ cleaning process is disposed on the gas supply plate 12 that serves as one electrode (a ground electrode) of a parallel-plate electrode unit. In the present embodiment, the auxiliary electrode 42 preferably has a cylindrical portion 42a and a collar portion 42b and is made of a conductive member. The collar portion 42b is arranged in the circumferential edge of the bottom opening of the cylindrical portion 42a. The collar portion 42b is preferably formed so as to be parallel with the top surface of the substrate holder 13. In the present embodiment, the auxiliary electrode 42 is hereafter referred to as a "hood". The hood 42 attached around the specific area of the bottom surface of the gas supply plate 12, in which the outlets 17 are formed, can cause the cleaning rate of the cleaning process for removing the unwanted films 32 to be increased. The reason will be explained below.

After the film deposition process has been completed and the reactor 11 has been evacuated until the internal pressure thereof sufficiently decreases, the substrate 14 is transferred from the reactor 11 to another chamber. To carry out the in-situ cleaning process due to RIE, an amount of cleaning gas supplied from the cleaning gas supply mechanism 33 is subsequently introduced into the reactor 11 through the gas supply plate 12. The cleaning gas is stably maintained at a pressure and converted into plasma discharge as the above-mentioned cleaning discharge. The plasma discharge is produced by a high frequency power supplied to the substrate holder 15 and the shield member 21 from a high frequency power supply mechanism. Both of the substrate holder 15 and the shield member 21 are electrically insulated from the reactor 11 and the ground. The high frequency power supply mechanism includes the high frequency power supply 30 and the matching circuit 29. The high frequency power supply mechanism is electrically insulated from the reactor 11 by an insulating section 31. The shield member 21 is also electrically insulated from the reactor 11 by an insulating section 22.

In the thermal CVD apparatus of the present embodiment, if a W film (a tungsten film) is deposited on the substrate 14, $CF_4$ and $O_2$ are used as the cleaning gas, for example. The typical conditions for the cleaning process are a 50–150 2 sccm flow rate for $CF_4$, a 20–90 sccm flow rate for $O_2$, 90–300 Pa for the pressure, and 300–600 W for the high frequency power. These conditions are the same as those of the conventional apparatus. The high frequency used is 13.56 MHz, for example. The internal pressure of the reactor 11 is reduced so that the plasma discharge can readily occur. The wall of the reactor 11, the gas supply plate 12, and the hood 42 are electrically grounded as described above.

The distance between the gas supply plate 12 and each of the substrate holder 13 and the shield member 21 is preferably about 70 mm, while the distance between the hood 42 and each of the substrate holder 13 and the shield member 21 is preferably about 15 mm.

Preferable materials used for the hood 42 include corrosion resistant metals (including alloys) such as "MONEL" or nickel so as not to cause corrosion due to the cleaning gas. In the present embodiment, the shield member 21 is also made of MONEL.

The above-mentioned plasma discharge occurs between the ground electrode and the electrode to which the high frequency power is applied. In this embodiment, the electrode to which the high frequency power is applied comprises the substrate holder 13 and the shield member 21, while the ground electrode comprises the reactor 11, the gas supply plate 12, and the hood 42. It is known that, if an amount of high frequency power is applied, the inter-electrode distance at which the plasma discharge can readily occur typically depends on the type and pressure of the cleaning gas. This matter will be explained with reference to FIGS. 2, 3A, 3B and 3C.

Figure 2:
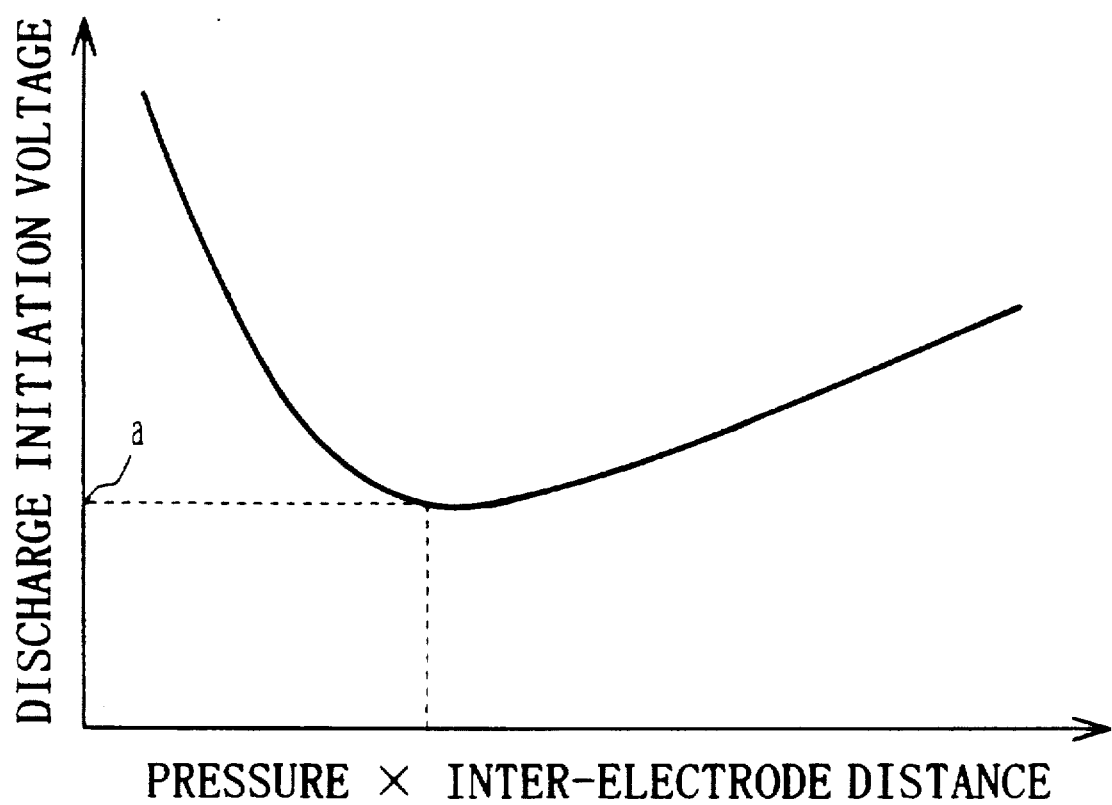
FIG. 2 is a graph showing a relationship between the product of an inter-electrode distance and a pressure and a discharge initiation voltage.
Figure 3A:
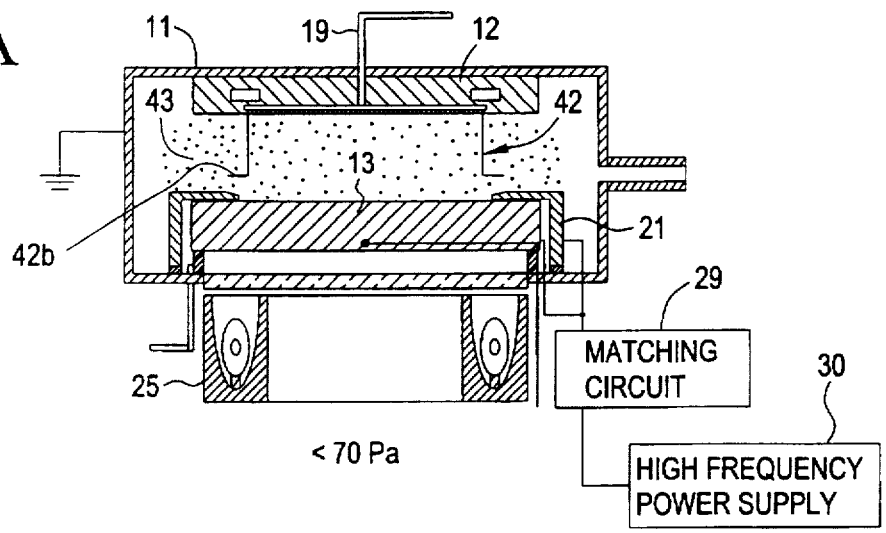
FIG. 3A is a figure showing a discharge in the first embodiment when the internal pressure of a reactor is lower than 70 Pa.
Figure 3B:
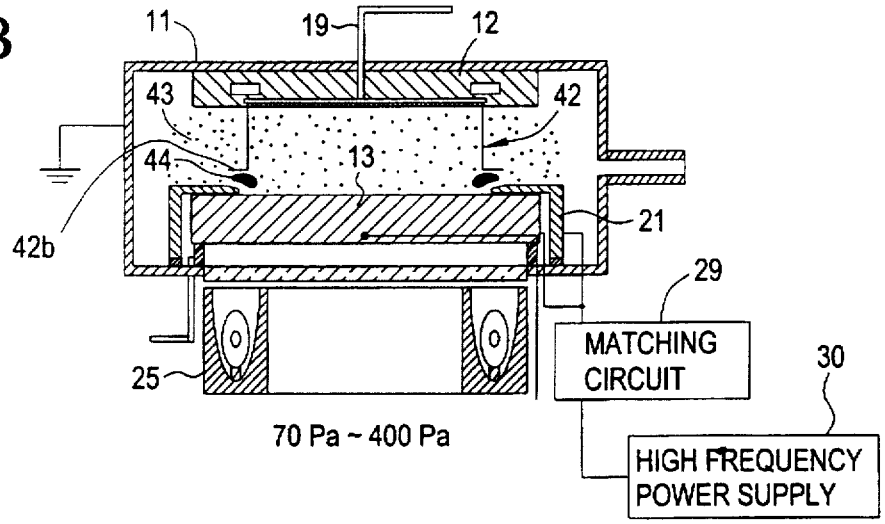
FIG. 3B is a figure showing a discharge in the first embodiment when the internal pressure is about 70 to 400 Pa.
Figure 3C:
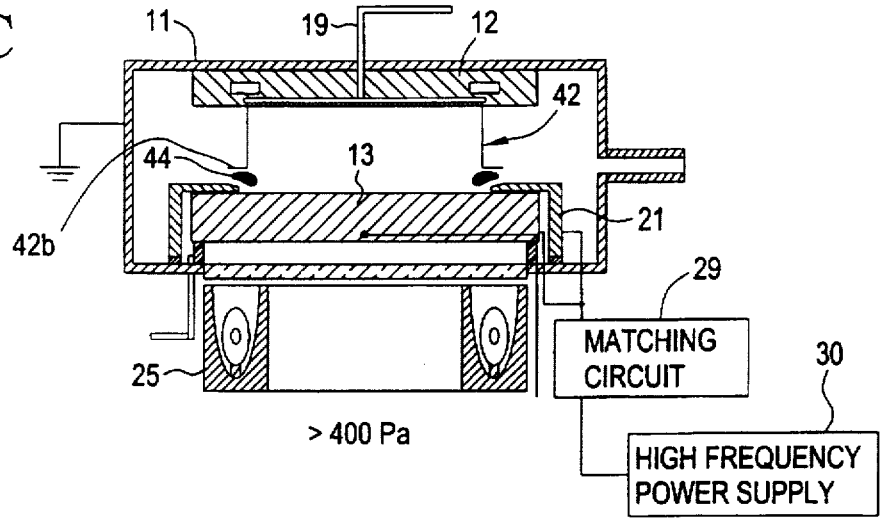
FIG. 3C is a figure showing a discharge in the first embodiment when the internal pressure is higher than 400 Pa.

FIG. 2 shows the Paschen's law, that is, the relationship between the discharge initiation voltage in a normal high frequency discharge and the product of the inter-electrode distance and the pressure. FIG. 2 is based on the contents described in pp. 38–42 of "Plasma Basic Engineering" written by Shinriki Tutui and provided by Uchida Rokakuho. The characteristic of the relationship shown in FIG. 2, which naturally depends on the type of the cleaning gas, is such that the discharge initiation voltage has a minimum value (a) and the discharge can readily occur in a space with a smaller inter-electrode distance as the pressure is higher. FIGS. 3A, 3B and 3C show how the plasma discharge for the cleaning process occurs in the reactor 11 when a flow of the cleaning gas is actually introduced into the reactor 11 and the internal pressure of the reactor 11 is varied among three ranges (lower than 70 Pa, 70 to 400 Pa, and higher than 400 Pa) for example.

As shown in FIG. 3A, when the internal pressure is lower than 70 Pa, a discharge 43 occurs all over the space between the gas supply plate 12 and each of the substrate holder 13 and shield member 21. As shown in FIG. 3B, when the internal pressure becomes about 70 to 400 Pa, in addition to the above discharge 43 which is weakened, a discharge 44 starts to concentrate between the collar portion 42b of the hood 42 and each of the substrate holder 13 and the shield member 21. The area in which the discharge 44 occurs depends on the shape of the collar portion 42b, and is limited to the peripheral space close to the unwanted films 32. As shown in FIG. 3C, when the internal pressure becomes higher than 400 Pa, the discharge 43 disappears completely, and the discharge 44 occurs only between the collar portion 42b of the hood 42 and each of the substrate holder 13 and the shield member 21.

As described above, according to the configuration of the present embodiment, the plasma discharge for the cleaning process is generally easy to occur in a space with a relatively large inter-electrode distance, that is, in the space of about 70 mm between the gas supply plate 12 and each of the substrate holder 13 and the shield member 21 at a relatively low pressure. On the other hand, at a relatively high pressure, the plasma discharge for the cleaning process is easy to occur in a space with a relatively small inter-electrode distance, that is, the gap of about 15 mm between the collar portion 42b of the hood 42 and each of the substrate holder 13 and the shield member 21. In other words, in the cleaning process, the installation of the hood 42 enables the plasma discharge to occur stably in the space close to the unwanted films 32 to be removed even if the internal pressure of the reactor 11 is relatively high.

In addition, the plasma discharge can be concentrated to the films 32 deposited on the substrate holder 13 or the shield member 21, by optimizing any one of the internal pressure of the reactor 11 during the cleaning process, the distance between the hood 42 and each of the substrate holder 13 and the shield member 21, the diameter of the cylindrical portion 42a, and the radial length of the collar portion 42b. Consequently, when removing the unwanted films 32 by the plasma discharge in the in-situ cleaning process, in comparison with the cleaning process due to the only discharge 43 all over the space in the reactor 11, the cleaning process of utilizing the discharge 44 can significantly increase the etch rate and can be completed in a short period of time.

The study of the inventors concerning the thermal CVD apparatus for depositing a W film onto the substrate 14 has practically indicated the following facts. The unwanted films 32 shown in FIG. 1 has been found that, if the W film of 0.6 μm in thickness is deposited on the substrate 14 during a single film deposition process, the unwanted W films as deposits is deposited on the shield member 21 in such a way that it has spreaded at a width of about 5 mm from the inner circumferential end of the shield member 21. The deposition range of the unwanted film gradually expands as more the film is deposited, and after 50 substrates have been processed by the thin film deposition process, the width of the range reaches about 30 mm.

The above study teaches the following conclusions. The diameter of the cylindrical portion 42a of the hood 42 is desirable to be equal to or smaller than the diameter of the substrate. The radial length of the collar portion 42b is desirable to be equal to the sum of the difference between the radius of the substrate 14 and the radius of the cylindrical portion 42a, the distance between the substrate 14 and the inner circumferential end of the shield member 21, and the width of 5 mm where the unwanted W film has been deposited in the shield member 21, when the cleaning process is carried out every one film deposition process for a single substrate. The distance between the substrate 14 and the inner circumferential end of the shield member 21 is equivalent to the radial distance of the area of the substrate holder 13 on which the substrate is not placed. If the cleaning process is carried out every 50 film deposition processes, the radial length of the collar portion 42b will be determined in the same way by using the width of 30 mm, instead of the width of 5 mm, where the unwanted W film will be deposited in the shield member 21 due to the 50 film deposition processes.

Further, the distance between the substrate holder 13 and the hood 42 is so determined that the distance is reduced as much as possible and the transfer of the substrate will have no troubles. For example, the distance is set at 15 mm in the present embodiment, as mentioned above.

Figure 4:
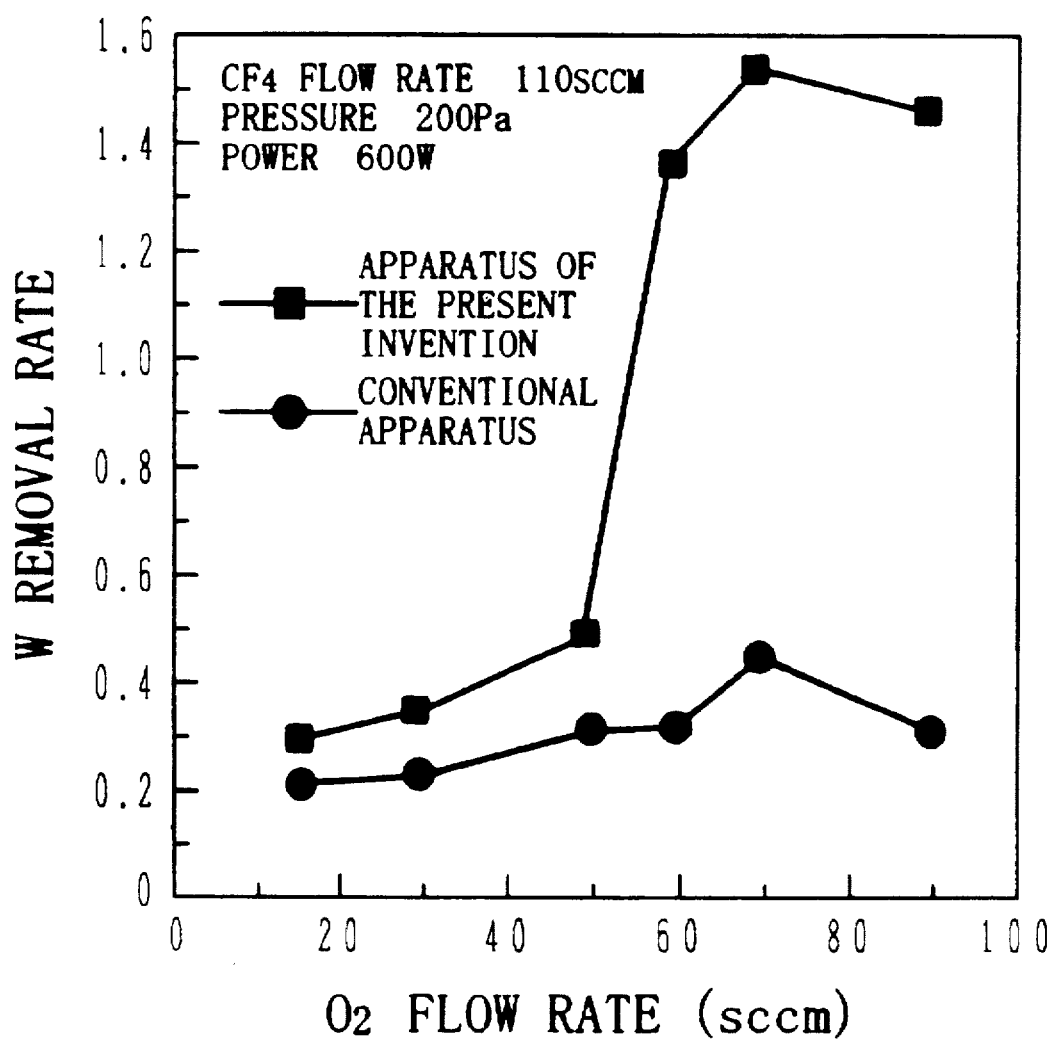
FIG. 4 is a graph showing a comparison between the thermal CVD apparatus of the first embodiment and the conventional thermal CVD apparatus without the hood 42 in terms of a rate at which the unwanted W film is removed.

FIG. 4 shows a comparison of the thermal CVD apparatus of the present embodiment to the conventional thermal CVD apparatus without the hood 42 in terms of the rate at which the unwanted W film is removed. The flow rate of $CF_4$ is fixed at 110 sccm, and the flow rate of $O_2$ is varied within the range of 10 to 90 sccm. The other conditions are a cleaning pressure of 200 Pa and an applied voltage of 600 W. The graph in FIG. 4 indicates that the removal rate or the cleaning rate in the thermal CVD apparatus of the present embodiment is four times higher than that of the conventional apparatus. The graph also indicates that in particular the removal rate tends to rapidly increase when the flow rate of $O_2$ is more than 50 sccm. This matter is also an advantage of the present invention. The rapid increase of the removal rate may be due to a change in the nature of the cleaning discharge because of a combination of the conditions concerning the inter-electrode distance, pressure, and flow rate of $O_2$.

Since an unnecessary increase in the cleaning pressure causes by-products affecting the process to be generated in large quantities, the cleaning is desirably carried out at a cleaning pressure suitable for an optimal etching rate.

In addition, in the above-mentioned present embodiment, the water cooling mechanism 41 is disposed in the inside of the gas supply plate 12 in order to cool the hood 42, and it therefore is located near the part where the hood 42 is mounted. The water cooling mechanism 41 also prevents unwanted films from depositing on the end of the hood during the normal thin film deposition process.

Figure 5:
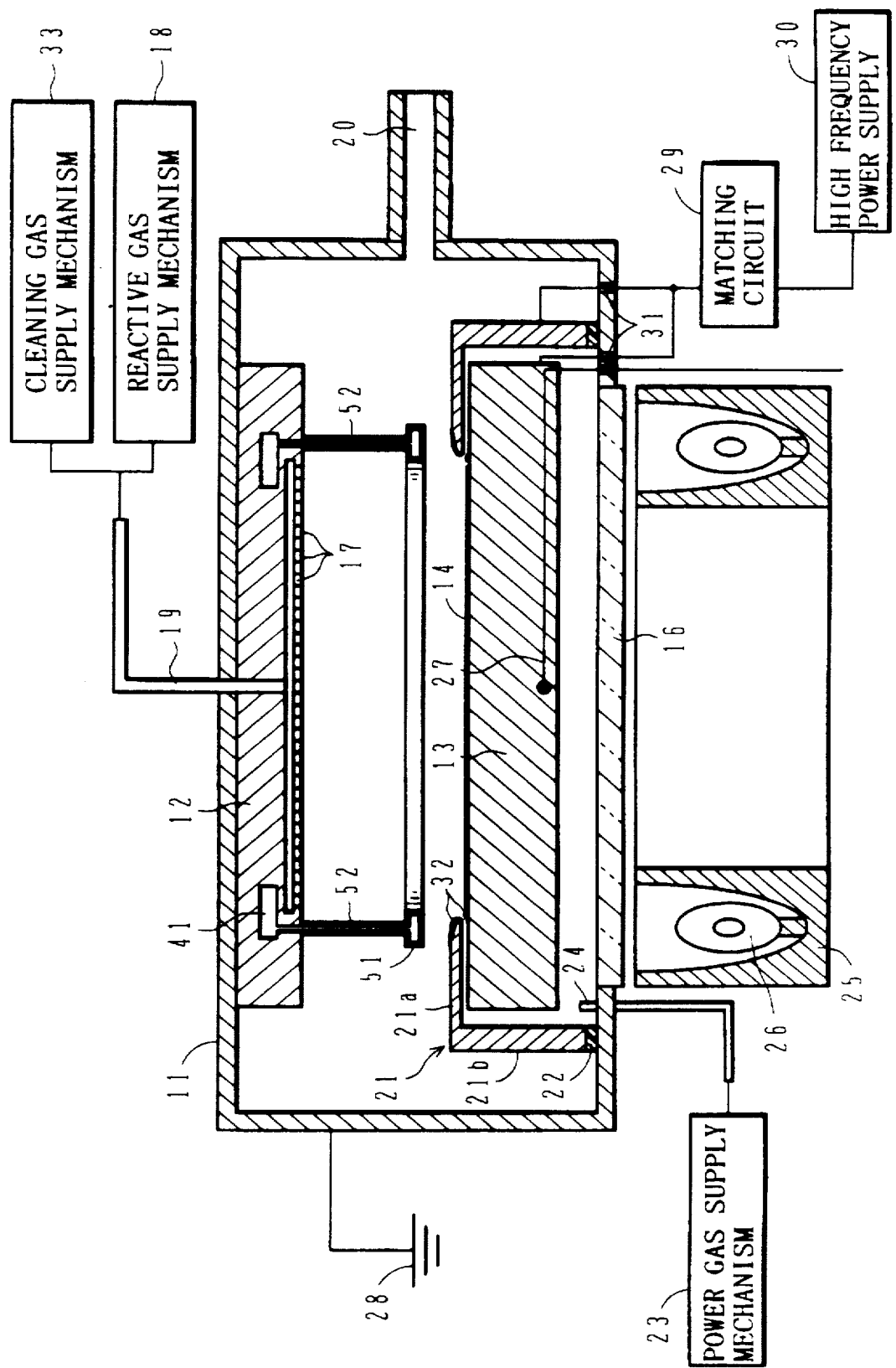
FIG. 5 is a longitudinal sectional view schematically showing a second embodiment of the electrode unit.

Another embodiment of the present invention will be described with reference to FIGS. 5 and 6. This embodiment is the same as the first embodiment except for the configuration of the auxiliary electrode. In FIG. 5, the elements substantially the same as those explained in the first embodiment have the same reference numerals, and their detailed description is omitted.

Figure 6:
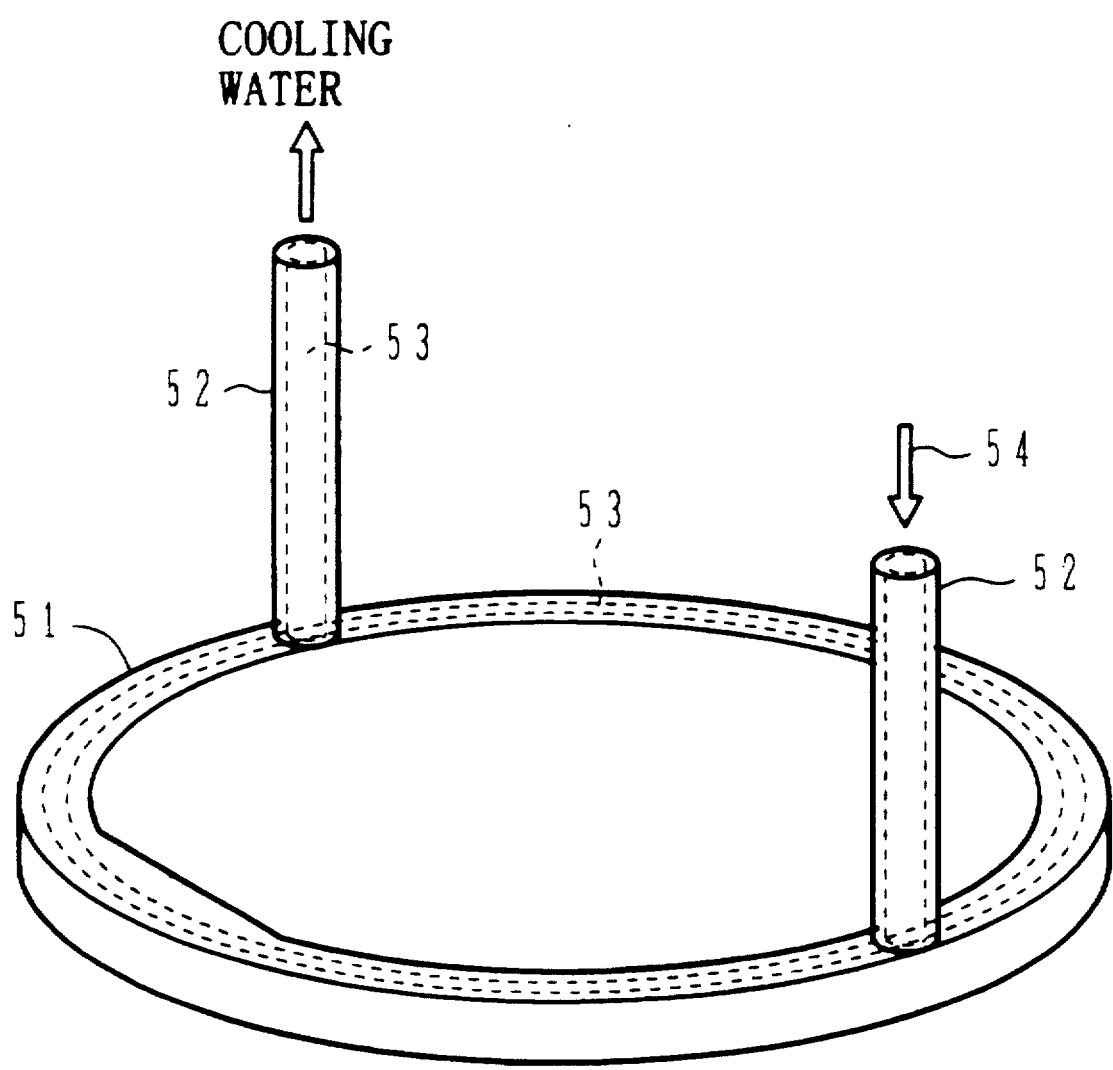
FIG. 6 is an enlarged perspective view showing an auxiliary electrode according to the second embodiment.
Figure 7:
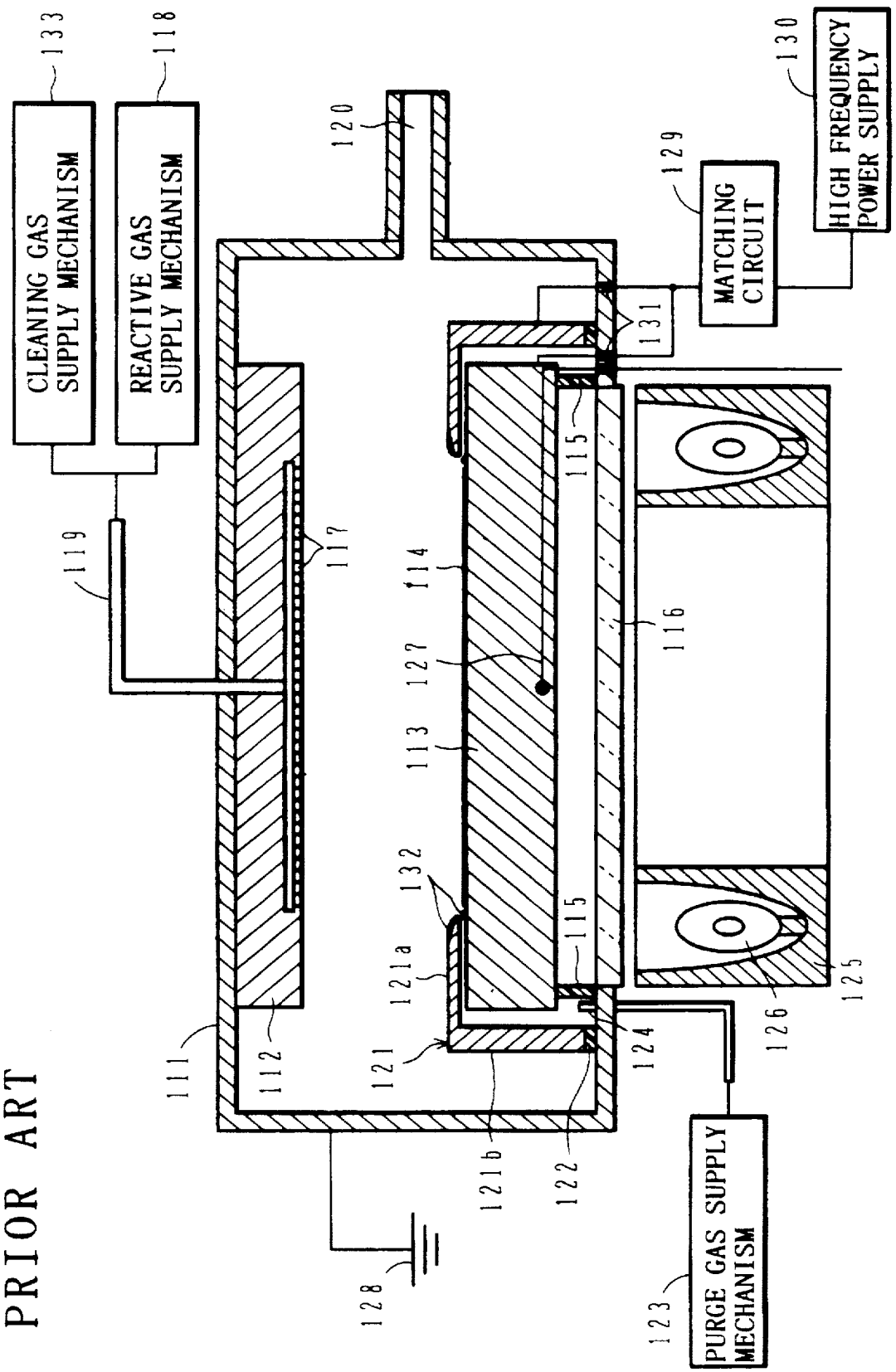
FIG. 7 is a longitudinal sectional view schematically showing a conventional thermal CVD apparatus.
Figure 8:
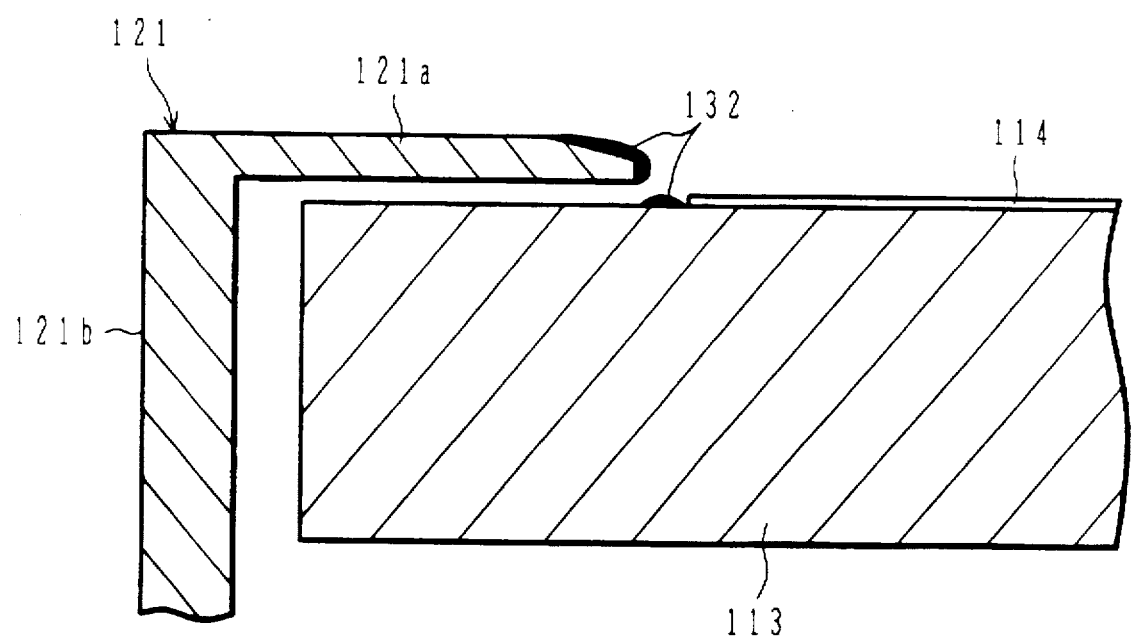
FIG. 8 is an enlarged cross-sectional view showing a part in FIG. 7.

As shown in FIGS. 5 and 6, an auxiliary electrode 51 in accordance with this embodiment is shaped like a circular ring, and its inner and outer diameters are substantially the same as those of the collar portion 42b of the hood 42 in the first embodiment. The shape of the bottom surface of the auxiliary electrode 51 is the same as the shape of the collar portion 42b, and the auxiliary electrode 51 is located at the same position as the collar portion 42b. Reference numeral 52 designates a supporting member for fixing the auxiliary electrode 51 to the bottom surface of the gas supply plate 12. In case of this embodiment, for example, two supporting members are used. A path 53 through which a cooling medium such as water flows is formed inside the auxiliary electrode 51 and the supporting members 52. The path 53 is connected to the cooling mechanism 41 disposed inside the gas supply plate 12. Arrow 54 shows the flow of the cooling medium. The cooling medium path 53 may be omitted, if it is not necessary.

The auxiliary electrode 51 of the above configuration has functions equivalent to those of the collar portion 42b of the hood 42, and causes a desired plasma discharge at a specified cleaning pressure to increase the cleaning rate, as described in FIGS. 3A, 3B and 3C. The auxiliary electrode 51 eliminates the need of the cylindrical portion 42a of the hood 42 to simplify the overall shape.

What is claimed is:

1. An electrode unit for in-situ cleaning in a thermal CVD apparatus, the thermal CVD apparatus including a reactor, a substrate holder for loading a substrate in the reactor, a shield member arranged around the substrate holder to form a purge gas path for blowing off a purge gas to a periphery of the substrate, and a gas supply section for supplying selectively a reactive gas or a cleaning gas into the reactor;

wherein the reactive gas is supplied from the gas supply section, the reactive gas is excited in a space in front of the substrate to deposit a thin film onto the substrate, and the cleaning gas is supplied from the gas supply section for a periodical in-situ cleaning process and a cleaning discharge is generated to remove unwanted films deposited on the substrate holder and an inner circumferential edge of a top surface of the shield member; and wherein the substrate holder and the shield member are connected to a high frequency power supply mechanism and the gas supply section is electrically grounded, and further said electrode unit includes an auxiliary electrode, used for an in-situ cleaning process, having a cylindrical portion attached to a bottom face of the gas supply section and a collar portion formed in a circumferential edge of a bottom opening of the cylindrical portion so as to face the inner circumferential edge of the top surface of the shield member, and causing said cleaning discharge to be concentrated in a space between the collar portion and the inner circumferential edge of the top surface of the shield member.

2. An electrode unit for in-situ cleaning in a thermal CVD apparatus as claimed in claim 1, wherein materials for said auxiliary electrode include corrosion-resistant metallic materials.

3. An electrode unit for in-situ cleaning in a thermal CVD apparatus as claimed in claim 2, wherein a radius of the cylindrical portion of said auxiliary electrode is equal to or smaller than a radius of the substrate.

4. An electrode unit for in-situ cleaning in a thermal CVD apparatus as claimed in claim 1, a radial length of the collar portion of said auxiliary electrode is equal to or larger than a radial range of the unwanted films deposited on the substrate holder and the shield member.

5. An electrode unit for in-situ cleaning in a thermal CVD apparatus, the thermal CVD apparatus including a reactor, a substrate holder for loading a substrate in the reactor, a shield member arrange around the substrate holder to form a purge gas path for blowing off a purge gas to a periphery of the substrate, and a gas supply section for supplying selectively a reactive gas or a cleaning gas into the reactor;

wherein the reactive gas is supplied from the gas supply section, the reactive gas is excited in a space in front of the substrate to deposit a thin film onto the substrate, and the cleaning gas is supplied from the gas supply section for a periodical in-situ cleaning process and a cleaning discharge is generated to remove unwanted films deposited on the substrate holder and an inner circumferential edge of a top surface of the shield member; and wherein the substrate holder and the shield member are connected to a high frequency power supply mechanism and the gas supply section is electrically grounded, and further said electrode unit includes an auxiliary electrode, used for an in-situ cleaning process, including supporting member attached to a bottom face of the gas supply section and a ring section supported by the supporting members so as to face the inner circumferential edge of the top surface of the shield member, and causing said cleaning discharge to be concentrated in a space between the ring section and the inner circumferential edge of the top surface of the shield member.

6. An electrode unit for in-situ cleaning in a thermal CVD apparatus as claimed in claim 5, wherein a cooling medium path is formed inside the ring section and the supporting members.

7. An electrode unit for in-situ cleaning in a thermal CVD apparatus as claimed in claim 5, wherein materials for the ring section and the supporting members include corrosion-resistant metallic materials.

8. An electrode unit for in-situ cleaning in a thermal CVD apparatus as claimed in claim 5, wherein an internal radius of the ring section is equal to or smaller than a radius of the substrate.

9. An electrode unit for in-situ cleaning in a thermal CVD apparatus as claimed in claim 5, wherein a radial length of the ring section equal to or larger than a radial range of the unwanted films deposited on both the substrate holder and the shield member.

10. An electrode unit for in-situ cleaning in a thermal CVD apparatus as claimed in claim 5, wherein a radial length of the ring section is equal to or larger than a radial range of the unwanted films deposited on both the substrate holder and the shield member.

11. An electrode unit for in-situ cleaning in a thermal CVD apparatus which has a shield member arranged around a substrate holder to form a purge gas path for blowing off a purge gas to a periphery of a substrate loaded on the substrate holder, and a gas supply section for supplying selectively a reactive gas or a cleaning gas, comprising;

an auxiliary electrode used for an in-situ cleaning process, having a cylindrical portion attached to a bottom face of the gas supply section and a collar portion formed in a circumferential edge of a bottom opening of said cylindrical portion so as to face an inner circumferential edge of a top surface of the shield member, wherein a cleaning discharge is generated between said collar portion and the inner circumferential edge of the top surface of the shield member during the in-situ cleaning process.

12. An electrode unit for in-situ cleaning in a thermal CVD apparatus as claimed in claim 11, wherein materials for said auxiliary electrode include corrosion-resistant metallic materials.

13. An electrode unit for in-situ cleaning in a thermal CVD apparatus as claimed in claim 12, wherein a radius of the cylindrical portion of said auxiliary electrode is equal to or smaller than a radius of the substrate.

14. An electrode unit for in-situ cleaning in a thermal CVD apparatus as claimed in claim 11, wherein a radial length of the collar portion of said auxiliary electrode is equal to or larger than a radial range of the unwanted films deposited on the substrate holder and the shield member.

15. An electrode unit for in-situ cleaning in a thermal CVD apparatus which has a shield member arranged around a substrate holder to form a purge gas path for blowing off a purge gas to a periphery of a substrate loaded on the substrate holder, and a gas supply section for supplying selectively a reactive gas or a cleaning gas, comprising;

an auxiliary electrode used for an in-situ cleaning process, including supporting members attached to a bottom face of the gas supply section and a ring section supported by the supporting members so as to face the inner circumferential edge of a top surface of the shield member, and causing said cleaning discharge to be concentrated in a space between the ring section and the inner circumferential edge of the top surface of the shield member.

16. An electrode unit for in-situ cleaning in a thermal CVD apparatus as claimed in claim 15, wherein a cooling medium path is formed inside the ring section and the supporting members.

17. An electrode unit for in-situ cleaning in a thermal CVD apparatus as claimed in claim 15, wherein materials for the ring section and the supporting members include corrosion-resistant metallic materials.

18. An electrode unit for in-situ cleaning in a thermal CVD apparatus as claimed in claim 15, wherein an internal radius of the ring section is equal to or smaller than a radius of the substrate.

* * * * *